United States Patent [19]

Link

[11] Patent Number: 4,771,359

[45] Date of Patent: Sep. 13, 1988

[54] NON-CONTACT PROXIMITY SWITCH

[76] Inventor: Walter Link, Beethovenstr. 13, 7255 Rutesheim, Fed. Rep. of Germany

[21] Appl. No.: 946,065

[22] Filed: Dec. 24, 1986

[30] Foreign Application Priority Data

Dec. 28, 1985 [DE] Fed. Rep. of Germany ....... 3546245

[51] Int. Cl.[4] ..................... H01H 47/12; H01H 47/28
[52] U.S. Cl. ..................................... 361/179; 361/180
[58] Field of Search ................................ 361/179, 180

[56] References Cited

FOREIGN PATENT DOCUMENTS 2566136 12/1985 France .................................. 361/180
2165651 4/1986 United Kingdom ................ 361/180

Primary Examiner—L. T. Hix
Assistant Examiner—David Porterfield
Attorney, Agent, or Firm—Wigman & Cohen

[57] ABSTRACT

A non-contact proximity switch with an oscillation circuit (L 1, C 1) which is activated in a step-like manner, has a reference voltage source (6) which produces at least one reference voltage level ($U_{ref}$) and has at least one comparator (5) which compares the amplitude of the transient response with the associated reference voltage level ($U_{ref}$) in order to be able to detect at least one value that is distinctive for the time curve of the decaying oscillation from at least one transient response of the oscillation circuit (L 1, C 1) after such an activation. At least one counter (7, 10) counts, at least within a portion of the decay period of the transient response, the number (DA) of the half-waves of the transient response, the peak of which deviated from the associated reference voltage level ($U_{ref}$) in one of the two directions.

26 Claims, 2 Drawing Sheets

NON-CONTACT PROXIMITY SWITCH

BACKGROUND OF THE INVENTION

The invention relates to a non-contact proximity switch with an oscillation circuit having a surge-like or step-like activation.

In a known proximity switch of this type (DE-OS No. 3318900) which reduces energy consumption, the pulse-like activation of the oscillating circuit is accomplished by periodic impulses, the spacing of which from each other in time is larger than the maximum release or decay period of the oscillations of the oscillating circuit. The average value of the rectified oscillations of the oscillating circuit or the amplitude of the releasing oscillations at a given point in time after the trigger impulse serves as the criterion for a switching operation. In this type of proximity switch, the precision and reproducibility of the switch position of the switch element that releases the switching operation is also not greater than in commonly used non-contact proximity switches which are based on the fact that the approach of a magnetic and/or electrically conductive particle or switch element effects by means of the magnetic field the oscillating conditions of the high frequency oscillator or affects a control value used in maintaining the high frequency oscillation in such a manner that a switch signal is produced. This is based on the fact that (a) a atime integration is necessary due to the small signal changes at the desired large spacing between the switch element and the oscillator, and (b) the attainable precision is limited by circuit component temperature dependence and insufficient miniaturization to a value which has often precluded the possibility of employing a proximity switch of this type.

In another known proximity switch (DE-OS No. 32 04 405), aside from an oscillator having a frequency which can be varied by an approaching switch element, a second oscillator with a nonvariable frequency is provided, the two frequencies are determined by means of two counters and compared by means of a comparator, which, in turn, releases a switch signal when a predetermined difference is found. The inductivity and frequency changes, which depend on the position of the switch element are so small that the frequency comparison does not lead to improved precision and reproducibility of the switch conditions.

With another known proximity switch (DE-OS No. 31 31 490) it is possible either to differentiate between a defined switch element, for example a trip dog in a trip rail and the approach of a metal particle such as a non-switch element metal chip, or between different control cams in a single groove field. In other respects, this proximity switch is not superior to the other known proximity switches.

OBJECTS AND SUMMARY OF THE INVENTION

The object of the invention is to create a proximity switch which is based on a detection and evaluation principle which makes it possible to overcome the limitations of the known proximity switches.

With the exceptions of the spools and condensers, only digital circuit components are required according to the invention, which means that a miniaturization, particularly in the form of an integrated circuit, can be accomplished in an especially simple and cost-effective manner. In addition, greater reliability can be attained in this manner. The decisive analog value, the reference voltage level, can be determined, independent of temperature and outside the integrated circuit, with the aid of a simple voltage divider. Due to the digital signal evaluation, the reliability, precision and reproducibility are improved significantly, and because of this, there can be realized larger distances between switch element and oscillator. The fact that the oscillating circuit is activated in a sudden surge-like or step-like manner contributes to being able to make the circuit especially simple. Additional significant advantages of the invention are that during the evaluation of the response to the step-like activation, i.e. the transient response, inherent properties can also be detected which characterize only the oscillating circuit and the position and identity of the switch element. In contrast to back-coupled (or regenerative) analog oscillators, the dimensioning of the other components has only a minor influence on these inherent properties, so that the invention can also perform such an identity recognition function. The numerous possible embodiments of the sensor, and the large degree of freedom offered by the digital influencing and further processing of the values characterizing the transient response, simultaneously allow reliable identity recognition and high precision in recognizing or determining the distance of the switch element from the oscillator.

This is particularly true when the natural frequency of the transient response is also determined, because the spacing of the switch element from the proximity switch as well as the active and passive characteristics of the switch element itself affect not only the amplitude, the decay time constant and the amount of post-oscillations, but also the natural frequency of the transient response. These values or some of these values can be affected simultaneously or separately in time.

A further increase in precision can be achieved with additional embodiments according to the present invention.

For example, instead of the proximity switch, the oscillation circuit can be arranged in the switch element associated therewith. In this case and when only one spool is arranged in the switch element, the switch element can also contain an integrated circuit which actively affects the transient response by means of inductive coupling. This integrated circuit can consist of a microprocessor and an electronically erasable and programmable fixed value memory (EEPROM). To supply the integrated circuit with the necessary operating voltage, a spool that can be inductively coupled with the proximity switch can be provided in the switch element, which spool, to a degree, forms the secondary coil of a transformer.

The solution according to the present invention represents incrementally a proximity switch, which makes it possible not only to determine an incremental position of the sensor, but also to differentiate among different zones. The comparator can also be formed in such a manner that during a transition from one number of output impulses to the next, it delivers an analog output value, which makes possible a continuous position regulation in the positions associated with these output impulses.

Preferably by means of a microprocessor, and with the aid of the extreme positions of the sensor, i.e., the spacing values 0 and infinite, the evaluating circuit can determine one or more correction values which deliver a relative criterion for one more positions independently of the absolute value of the values affected by the sensor. If the evaluating circuit contains a digital memory, then the detected values can be corrected by means of a selected tabulated assignment or association and can be linearized, for example, with regard to position dependency. In addition, different hysteresis behavior curves relative to path dependency can be digitally programmed for all detectable, discrete spacing positions.

BRIEF DESCRIPTION OF THE DRAWINGS

The invention is described in greater detail below with the aid of exemplary embodiments illustrative in the drawings.

Shown are.

DETAILED DESCRIPTION OF THE PREFERRED EMBODIMENTS

Figure 1:
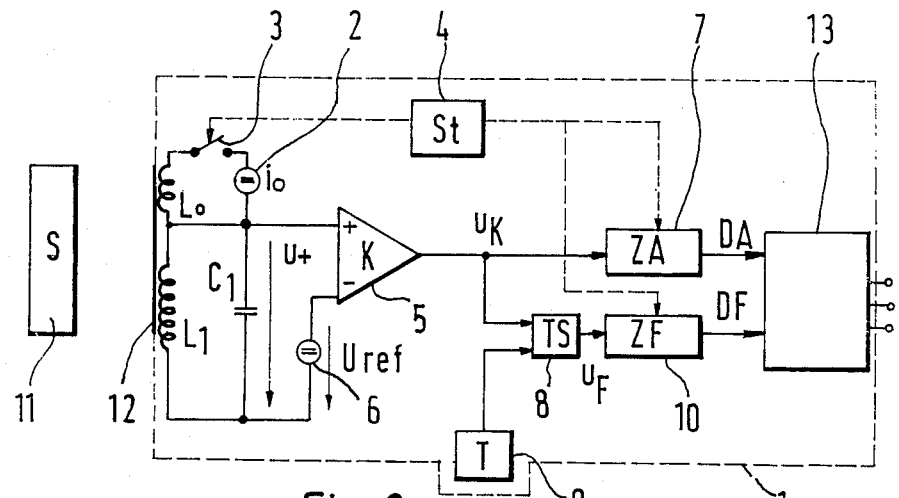
FIG. 1 is a circuit diagram of a first exemplary embodiment.

In FIG. 1, the housing (not shown) of a non-contact, incremental proximity switch contains an activation and evaluation stage 1 having an oscillating circuit of high quality. This oscillating circuit consists of a spool L1 and a condenser C1. An activation spool L0, having a direct current source 2 and a semiconductor switch 3 in its circuit, is coupled with the spool L1. The semiconductor switch 3 can interrupt the current $i_o$ flowing through the activation spool L0 in such a short time that a step-like current change is achieved, as shown in the current-time diagram in FIG. 2. Of course it would also be possible to use a portion of the spool L1 or the entire spool L1 as an activation spool and to feed the current of the direct current source into the oscillating circuit. A control circuit 4 causes the transition of the semiconductor switch 3 from a conductive condition into the non-conducting condition and vice versa.

One pole of the spool L1 and of the condenser C1 are connected with one input of a comparator 5, which has its other input connected with a pole of a reference voltage source 6, which delivers a precise adjustable reference voltage level $U_{ref}$. The other pole of the reference voltage source 6 is connected with the other pole of the spool L1 and the condenser C1. The comparator 5 is therefore able to determine whether the instantaneous value of the oscillating circuit voltage u+ lies above, at or below the reference voltage level $U_{ref}$. In the exemplary embodiment the comparator 5 is formed in such a manner that a voltage $u_k$ with a constant level is always applied to its output when the oscillating circuit voltage exceeds the reference voltage level. The output values of the comparator 5 are therefore impulses.

As shown in FIG. 1, these impulses are supplied to a first counter 7 and to a gate circuit 8, and the impulses produced by a quartz-stabilized clock generator 9 are applied to the other input of this gate circuit 8. The repetition rate of the impulses of the cycle generator 9 is significantly greater than that of the impulses of the comparator 5. The input of a second counter 10 is connected to the output of the gate circuit 8, which second counter 10 determines the frequency of the oscillating circuit voltage u+ as digital value on the basis of the number of counting impulses delivered from the cycle generator 9. In the exemplary embodiment, the control circuit 4, which controls the two counters 7 and 10, assures that the number of counting impulses is not determined between two successive impulses of the comparator, but rather between an impulse of the comparator and its next-to-last impulse. However, the counting period could also extend over more than two impulses of the comparator, in order to be able to determine the frequency with even greater precision.

In the exemplary embodiment a body made from a magnetic and electrically conductive metal is provided as a switch element 11 to which the proximity switch reacts. In an alternative embodiment the switch element may be made from a material which is electrically but not magnetically conductive which essentially influences only the time decay constant ($\tau$) of the transient response. In a further embodiment, the switch element may be made from a ferrite material which essentially influences only the natural frequency ($f_0$) of the transient response. As long as the distance of the switch element 11 from a sensor surface 12 of the oscillating circuit is large enough to provide that the circuit element 11 lies outside the magnetic field of the spool L1 and the activation spool L0, the surge-like step-like activation of the oscillation circuit, when the current flowing through the activation spool L0 is turned off, causes the oscillation circuit voltage to fade with its maximum frequency and with its maximum decay time constant. If, in contrast, the switch element is located in the magnetic field of the spool L1 of the oscillation circuit, then the decay time constant $\tau$ and the frequency of the oscillating circuit voltage becomes smaller as the distance a decreases, as shown in the voltage/time diagram for the oscillation circuit voltage u+ and the output voltage of the comparator 5 in FIG. 2. If, for example, the distance a of the switch element 11 from the sensor surface 12 has the value $a_1$, then the surge-like step-like interruption of the current $i_o$ in the activation spool L0 causes the oscillation circuit voltage u+ to have the time curve illustrated in the first position in the voltage/time diagram. In this decay process the oscillation circuit voltage exceeds the positive reference voltage level $U_{ref}$ in the positive direction by four times, which causes four impulses of decreasing width but constant frequency to be applied to the output of the comparator 5. This number of impulses DA determined by the first counter 7 represents a first digital value which is indicative of the value of the distance a between the circuit element 11 and the sensor surface 12, as well as for the characteristic of the switch element 11, i.e., for the reduction in the quality-factor of the oscillation circuit caused thereby in the exemplary embodiment. The number of counting impulses DF determined by the second counter 10 between the decreasing sides of the first and third impulses of the comparator 5 indicates the natural frequency $f_o$ of the oscillation circuit voltage u+, which is termed the transient or step response because of the surge-like activation. The second digital value DF delivered by the second counter 10 is also characteristic for the distance $a_1$ and the characteristics of the switch element 11.

It is true that the precision and reproducibility of the results delivered by the activation and evaluating stage 1 are better than with the known proximity switches. But even better results can be achieved if the oscillation circuit is activated several times in succession and the impulse counts are repeated, whereby the control circuit 4 offers the possibility of setting the number of repetitions.

Figure 2:
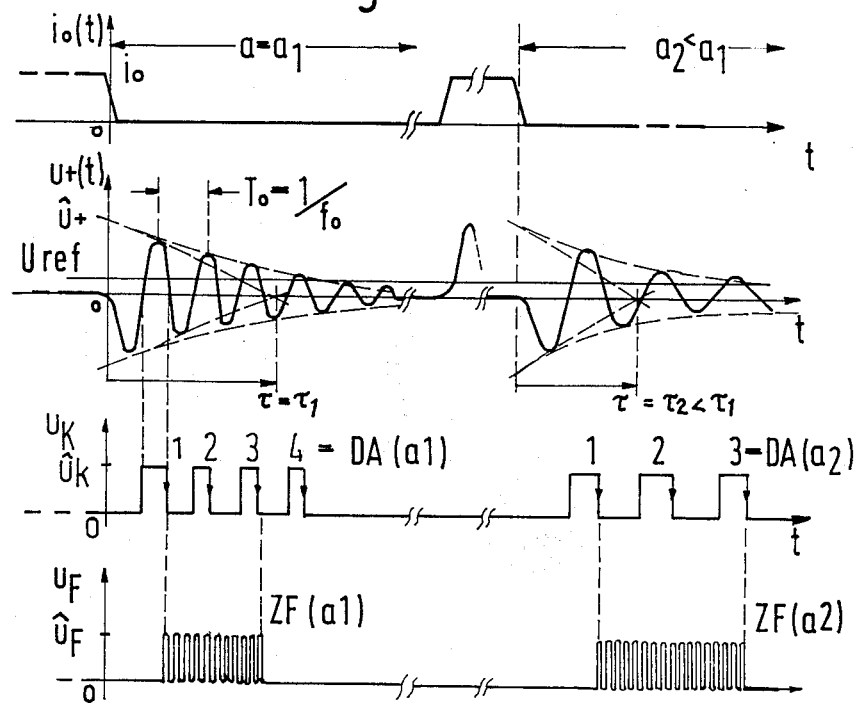
FIG. 2 is the impulse map of the first exemplary embodiment.

If the distance a between the switch element 11 and the sensor surface 12 is smaller than the value $a_1$, then the decay time constant $\tau$ and the frequency of the transient response are smaller than the value $a_1$, as shown in the voltage/time diagram in FIG. 2. Under these conditions only three impulses are applied to the output of the comparator 5. Because the frequency of the transient response is smaller, the number of counting impulses determined by the second counter 10 is larger.

In the exemplary embodiment, both the digital value DA and the digital value DF determined by the second counter 10, both of which are indicative of the spacing between the switch element 11 and the sensor surface 12 and of the characteristics of the switch element, are entered into a subsequent stage 13, which contains a memory and an interface. By comparing the counter results with tabulated functions stored in the memory, the output signals of the proximity switch are produced in accordance with the program in memory depending on the distance between the switch element 11 and the sensor surface 12 and/or on the characteristics of the switch element. For all detectable discrete distance values, a distinct hysteresis curve can be provided that is digitally programmed with regard to path or distance dependency, in that at a given value DA 1 counted by the counter, the switch is set to on. At another value DA 2, different from the value DA 1, the switch is set to off.

Figure 3:
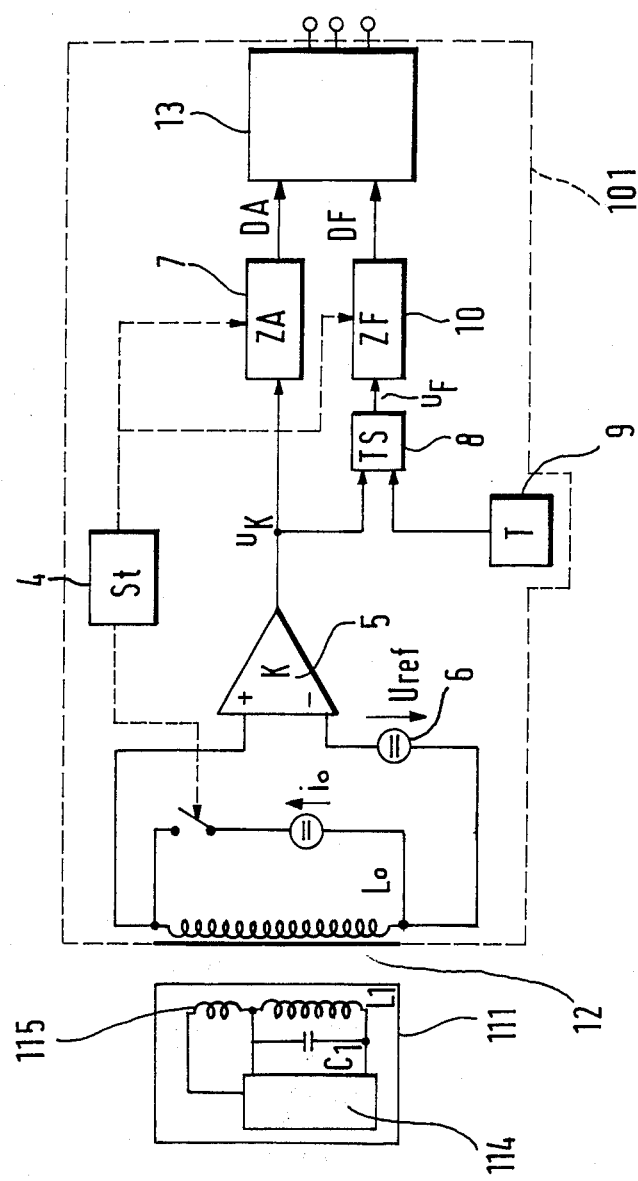
FIG. 3 is a circuit diagram of a second exemplary embodiment.

The exemplary embodiment illustrated in FIG. 3 differs from that shown in FIGS. 1 and 2 only in that its activation and evaluation stage 101 does not contain an oscillation circuit but only contains the activation spool L0, the voltage of which represents the transient response and is compared with the reference voltage level by the comparator.

The oscillation circuit consisting of the spool L1 and the condenser C1 is arranged in the switch element 111. If the switch element 111 is located in the magnetic field of the activation spool L0, then here, too, the sudden (or surge-like) interruption in the current flowing through the spool L0 causes a triggering of the oscillation circuit. The magnetic coupling between the spool L1 of the oscillation circuit and the activation spool L0, however, also causes a voltage to be induced in the activating spool L0, which voltage corresponds to the oscillation circuit voltage and is evaluated as the transient response from the activation and evaluation stage 101. Because the magnetic coupling between the activation spool L0 and the spool L1 of the oscillation circuit is dependent on the distance between the circuit element 111 and the sensor surface 12, there is a dependency in this exemplary embodiment as well between the digital values determined by the two counters and the distance of the switch element 111, as well as the characteristics of such switch element.

In the exemplary embodiment the oscillation circuit is connected to an integrated circuit 114 which is also housed in the switch element 111. The operating voltage of this integrated circuit 114 is delivered by an auxilliary spool 115 that is magnetically coupled to the other spools. With the aid of the integrated circuit 114, the transient response of the switch element 111 can be actively influenced and the characteristics of the switch element 111 can be varied over a wide range. For example, the spool L1 can be short-circuited after a given number of completed decay processes. The integrated circuit 114 contains an electrically programmable and erasable fixed value memory, in which is stored a characteristic switch function for identifying the switch element condition.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed:

1. A non-contact proximity switch with an oscillation circuit having a step-like activation, at least one switch element which affects the time curve of at least one transient response of the oscillation circuit in dependence on its distance from the oscillation circuit, and an evaluation circuit which detects at least one characteristic value for the time curve of the decaying oscillation from at least one transient response of the oscillation circuit after such an activation, comprising:
   (a) a reference voltage source (6) producing at least one reference voltage level ($U_{ref}$),
   (b) at least one comparator (5) which compares the amplitude of the transient response with an associated reference voltage level ($U_{ref}$), and
   (c) at least one counter (7, 10) which counts the number (DA) of those half-waves of the transient response at least within a portion of the decay period of the transient response, the peak value of which deviates from the associated reference voltage level ($U_{ref}$) in one of two directions.

2. A proximity switch according to claim 1, comprising at least one second counter (10) which is connected to the output of the comparator (5) like the first counter (7) and forms a digital value corresponding to the natural frequency of the transient response.

3. A proximity switch according to claim 2, wherein the second counter (10) is connected to the output of a gate circuit (8), the two inputs of which are connected with the output of the comparator (5) and with a frequency-stabilized clock generator (9) respectively, the repetition rate of which is greater than the natural frequency of the transient response.

4. A proximity switch according to claim 1, comprising a control stage (4) for a repeating step-like activation of the oscillation circuit and a setting of the counting processes of the counter (7, 10) to a certain number of transient responses.

5. A proximity switch according to claim 1, comprising switch element (11) having a magnetic and electrically conductive small metal plate, which influences the natural frequency ($f_o$) and the decay time constant ($\tau$) of the transient response.

6. A proximity switch according to claim 2, comprising switch element (11) having a magnetic and electrically conductive small metal plate, which influences the natural frequency ($f_o$) and the decay time constant ($\tau$) of the transient response.

7. A proximity switch according to claim 3, comprising switch element (11) having a magnetic and electrically conductive small metal plate, which influences the natural frequency ($f_o$) and the decay time constant ($\tau$) of the transient response.

8. A proximity switch according to claim 4, comprising switch element (11) having a magnetic and electrically conductive small metal plate, which influences the natural frequency ($f_o$) and the decay time constant ($\tau$) of the transient response.

9. A proximity switch according to claim 1, wherein the switch element consists of an electrically but not magnetically conductive material which essentially influences only the decay time constant ($\tau$) of the transient response.

10. A proximity switch according to claim 2, wherein the switch element consists of an electrically but not magnetically conductive material which essentially influences only the decay time constant ($\tau$) of the transient response.

11. A proximity switch according to claim 3, wherein the switch element consists of an electrically but not magnetically conductive material which essentially influences only the decay time constant ($\tau$) of the transient response.

12. A proximity switch according to claim 4, wherein the switch element consists of an electrically but not magnetically conductive material which essentially influences only the decay time constant ($\tau$) of the transient response.

13. A proximity switch according to claim 1, wherein the switch element consists of a ferrite material and essentially influences only the natural frequency ($f_o$) of the transient response.

14. A proximity switch according to claim 2, wherein the switch element consists of a ferrite material and essentially influences only the natural frequency ($f_o$) of the transient response.

15. A proximity switch according to claim 3, wherein the switch element consists of a ferrite material and essentially influences only the natural frequency ($f_o$) of the transient response.

16. A proximity switch according to claim 4, wherein the switch element consists of a ferrite material and essentially influences only the natural frequency ($f_o$) of the transient response.

17. A proximity switch according to claim 8, further including a digital memory contained in the activation and evaluation stage (1, 101) for a correction of the determined digital values by means of a selected tabulated assignment in the memory.

18. A proximity switch according to claim 9, containing hysteresis behavior curves for all detectable discrete distance positions, which curves are digitally programmed with regard to path dependency, in that at a given number (DA 1) of half-waves counted by the counter (7, 107), the switch is set to On, and at another number (DA 2) different from the mentioned number (DA 1), the switch is set to off.

19. A non-contact proximity switch, comprising:
at least one switch element (111) in which is arranged an oscillation circuit having a spool (L1) and condensor (C1) which have step-like activation, and an evaluation circuit (101), in which is provided an activation and evaluation spool (L0), said switch element (111) affects the time curve of at least one transient response of the oscillation circuit (L1, C1) in dependence on its distance from the activation and evaluation spool (L0) and said evaluation circuit (101) detects at least one characteristic value for the time curve of the decaying oscillation from at least one transient response of the oscillation circuit (L1, C1) after such an activation;
a spool (115) arranged in the switch element (111) magnetically coupled with the activation and evaluation spool (L0) and delivering the operating voltage to the circuit arranged in the switch element (111);
a reference voltage source (6) producing at least one reference voltage level ($U_{ref}$);
at least one comparator (5) which compares the reference voltage level ($U_{ref}$) with a voltage induced in the activation and evaluation spool (L0) by the oscillation circuit (L1, C1) and corresponding to the transient response; and
at least one counter (7,10) which counts the number (DA) of those half-waves of the transient response at least within a portion of the decay period of the transient response, the peak value of which deviates from the associated reference voltage ($U_{ref}$) in one of two directions.

20. A proximity switch according to claim 19, wherein a spool (115) of the switch element (111) delivers the operating voltage for an integrated circuit (114) in the switch element (111) by means of an inductive coupling to the spool (L0) of the activation and evaluation stage and the integrated circuit (114) actively influences the transient response of the switch element (111) by advantageously short-circuiting the spool (L1) after a given number of completed decay process repetitions.

21. A proximity switch according to claim 20, wherein the circuit (114) contains an electrically programmable and erasable fixed value memory in which a characteristic switch function can be stored for the identification of the switch element condition.

22. A proximity switch according to claim 19, comprising at least one second counter (10) which is connected to the output of the comparator (5) like the first counter (7) and forms a digital value corresponding to the natural frequency of the transient response.

23. A proximity switch according to claim 22, wherein said second counter is connected to the output of a gate circuit (8), the two inputs of which are connected with the output of the comparator (5) and with a frequency-stabilized clock generator (9), respectively, the repetition rate of which is greater than the natural frequency of the transient response.

24. A proximity switch according to claim 22, comprising a control stage (4) for a repeating step-like activation of the oscillation circuit and a setting of the counting processes of the counter (7,10) to a certain number of transient responses.

25. A proximity switch according to claim 19, further including a digital memory contained in the activation and evaluation stage (101) for a correction of the determined digital values by means of a selected tabulated assignment in the memory.

26. A proximity switch according to claim 19, wherein a spool (115) of the switch element (111) delivers the operating voltage for an integrated circuit (114) in the switch element (111) by means of an inductive coupling to the spool (L0) of the activation and evaluation stage and the integrated circuit (114) actively influences the transient response of the switch element (111) by advantageously short-circuiting the spool (L1) after a given number of completed decay process repetitions.

* * * * *